United States Patent
Yuan et al.

(10) Patent No.: US 6,359,342 B1
(45) Date of Patent: Mar. 19, 2002

(54) FLIP-CHIP BUMPING STRUCTURE WITH DEDICATED TEST PADS ON SEMICONDUCTOR CHIP AND METHOD OF FABRICATING THE SAME

(75) Inventors: Pao-Ho Yuan; Ting-Ke Chai; Lien-Chi Chan, all of Taichung; Jen-Yi Tsai, Chiayi, all of (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 09/730,311

(22) Filed: Dec. 5, 2000

(51) Int. Cl.[7] .................. H01L 23/48; H01L 23/52; H01L 29/40
(52) U.S. Cl. .................. 257/784; 257/48; 257/778; 438/666; 438/108
(58) Field of Search .................. 257/784, 48, 778, 257/780, 781; 438/108, 612, 613, 614, 18, 666

(56) References Cited

U.S. PATENT DOCUMENTS

| | | | |
|---|---|---|---|
| 4,951,098 A | * 8/1990 | Albergo et al. | |
| 5,239,191 A | * 8/1993 | Sakumoto et al. | |
| 5,446,310 A | * 8/1995 | Baliga et al. | |
| 5,473,196 A | * 12/1995 | De Givry | |
| 5,719,449 A | 2/1998 | Struas | |
| 5,923,047 A | * 7/1999 | Chia et al. | |
| 5,936,260 A | * 8/1999 | Corbett et al. | |
| 6,034,426 A | * 3/2000 | Patel et al. | |

* cited by examiner

Primary Examiner—Sheila V. Clark
(74) Attorney, Agent, or Firm—Peter F. Corless; Edwards & Angell, LLP

(57) ABSTRACT

A flip-chip bumping technology is proposed, which provides a flip-chip bumping structure with dedicated test pads on semiconductor chip and method of fabricating the same. The proposed flip-chip bumping technology is characterized by the forming of a lined-array of electrically-conductive dual-pad blocks respectively over the internal I/O points of the semiconductor chip, each dual-pad block including a first pad and a second pad located beside and electrically connected to the first pad; and wherein the respective first and second pads of the dual-pad blocks-are alternately designated as bump pads and test pads. During testing procedure, the probing to the internal circuitry of the semiconductor chip is carried out through the test-pad portions of the dual-pad blocks, so that the probing needles would leave no scratches over the bumppad portions of the same. During subsequent bumping process, solder bumps are formed respectively over the bump-pad portions of the dual-pad blocks. Since the bump-pad portions of the dual-pad blocks would be left unscratched, it allows the solder bump attachment to be more assured in quality and reliability.

10 Claims, 3 Drawing Sheets

FLIP-CHIP BUMPING STRUCTURE WITH DEDICATED TEST PADS ON SEMICONDUCTOR CHIP AND METHOD OF FABRICATING THE SAME

BACKGROUND OF THE INVENTION

1. Field of the Invention

This invention relates to integrated-circuit packaging technology, and more particularly, to a flip-chip bumping structure with dedicated test pads on semiconductor chip and method of fabricating the same.

2. Description of Related Art

Flip-chip technology is an advanced type of integrated-circuit packaging technology which is characterized by that the packaged semiconductor chip is mounted in an upside-down manner over the substrate and bonded to the same by means of solder bumps. Since no bonding wires are required, it allows the overall package size to be made very compact. The attachment of solder bumps to the semiconductor chip is implemented through the so-called bumping process. A conventional flip-chip bumping structure on semiconductor chip is illustratively depicted in the following with reference to FIG. 1 and FIGS. 2A–2D.

FIG. 1 shows a schematic top view of a semiconductor chip 10 used for flip-chip application; and FIGS. 2A–2D are schematic cross-sectional diagrams used to depict the fabrication of a conventional flip-chip bumping structure over the semiconductor chip 10 of FIG. 1 (the cross-sectional view of the semiconductor chip 10 is cutting through the line A–A' in FIG. 1).

Referring to FIG. 1 together with FIG. 2A, the semiconductor chip 10 is predefined with a lined array of I/O points 11 for the internal circuitry thereof to communicate with external circuitry; and a plurality of metallization pads 20, which are typically made of aluminum (Al), are formed respectively over the I/O points 11. Conventionally, these metallization pads 20 serve both as test pads and bump pads.

Referring further to FIG. 2B, during testing procedure, a test circuit card (not shown) with a set of probing needles 30 (only one is shown in FIG. 2B) is used to check whether the internal circuitry of the semiconductor chip 10 would function properly. Each probing needle 30 is set to come in touch with the exposed surface of each metallization pad 20 for the purpose of establishing an electrical coupling between the test circuit card (not shown) and the internal circuitry of the semiconductor chip 10 via the I/O points 11. Typically, the testing procedure would be repeatedly performed for several times.

Referring further to FIG. 2C, as a consequence of the probing needle 30 repeatedly pressing on the metallization pad 20, it would undesirably leave some scratches 20a over the exposed surface of the metallization pad 20.

Referring further to FIG. 2D, in the next step, a bumping process is performed to form a solder bump 40 on each metallization pad 20 over the semiconductor chip 10. This completes the fabrication of a flip-chip bumping structure over the semiconductor chip 10, which can be subsequently used to bond the semiconductor chip 10 to a substrate (not shown).

However, due to the existence of scratches 20a over the exposed surface of the metallization pad 20, the bumping would be undesirably degraded in quality and reliability.

One solution to this problem is to repeat the testing procedure as fewer times as possible, so as to reduce the scratching of the metallization pads 20 to a lesser degree. One drawback to this solution, however, is that it would make the semiconductor chip 10 less assured in reliability.

Moreover, since the metallization pads 20 are spaced at very small intervals, the pitch of the probing needles 30 should be correspondingly small, which would make the testing procedure difficult to realize.

Related patents, include, for example, the U.S. Pat. No. 5,719,449 entitled "FLIP-CHIP INTEGRATED CIRCUIT WITH IMPROVED TESTABILITY". This patented technology discloses an integrated circuit that is adapted for implementing flip-chip technology with solder bumps, while providing for improved testability.

One drawback to the foregoing patented technology, however, is that, since the dedicated test pads are located on the edge of the chip surface, it would undesirably require the fabrication of additional electrically-conductive paths for electrically connecting the test pads to their corresponding I/O points. This requirement would make the overall packaging process more complex and thus more costly to implement.

SUMMARY OF THE INVENTION

It is an objective of this invention to provide a new flip-chip bumping technology, which can help allow the integrated-circuit testing procedure to be repeated as many times as desired without causing scratches over the bump pads.

It is another objective of this invention to provide a new flip-chip bumping technology, which can help assure the quality and reliability of the attachment of solder bumps over the bump pads.

It is still another objective of this invention to provide a new flip-chip bumping technology, which can help allow an increase in the pitch of the probing needles being used to implement the integrated-circuit testing procedure so as to allow the testing procedure to be carried out in an easier manner.

It is yet another objective of this invention to provide a new flip-chip bumping technology, which can be implemented without having to fabricate additional electrical connecting paths as in the case of the prior art of U.S. Pat. No. 5,719,449.

In accordance with the foregoing and other objectives, the invention proposes a new flip-chip bumping technology.

In terms of method, the flip-chip bumping technology according to the invention comprises the following method steps: (1) forming a plurality of electrically-conductive dual-pad blocks respectively over the I/O points of the semiconductor chip, each dual-pad block including: (i) a first pad, and (ii) a second pad located beside and electrically connected to the first pad; (2) designating the respective first and second pads of the dual-pad blocks alternately as bump pads and test pads; and (3) performing a testing procedure to the internal circuitry of the semiconductor chip by probing through the test-pad portions of the dual-pad blocks. Further, a plurality of solder bumps are formed respectively over the bump-pad portions of the dual-pad blocks.

In terms of structure, the flip-chip bumping technology according to the invention comprises the following components: (a) a lined array of electrically-conductive dual-pad blocks formed over the semiconductor chip and respectively electrically connected to the I/O points of the semiconductor chip, each dual-pad block including: (a1) a first pad, and (a2) a second pad located beside and electrically connected to the first pad; wherein the respective first and second pads of the dual-pad blocks are alternately designated as bump pads and test pads; and (b) a plurality of solder bumps respectively formed over the bump-pad portions of the dual-pad blocks.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The flip-chip bumping structure with dedicated test pads and method of fabricating the same according to the invention is disclosed in full details in the following with reference to FIGS. 3A–3B and FIGS. 4A–4D.

Figure 3A:
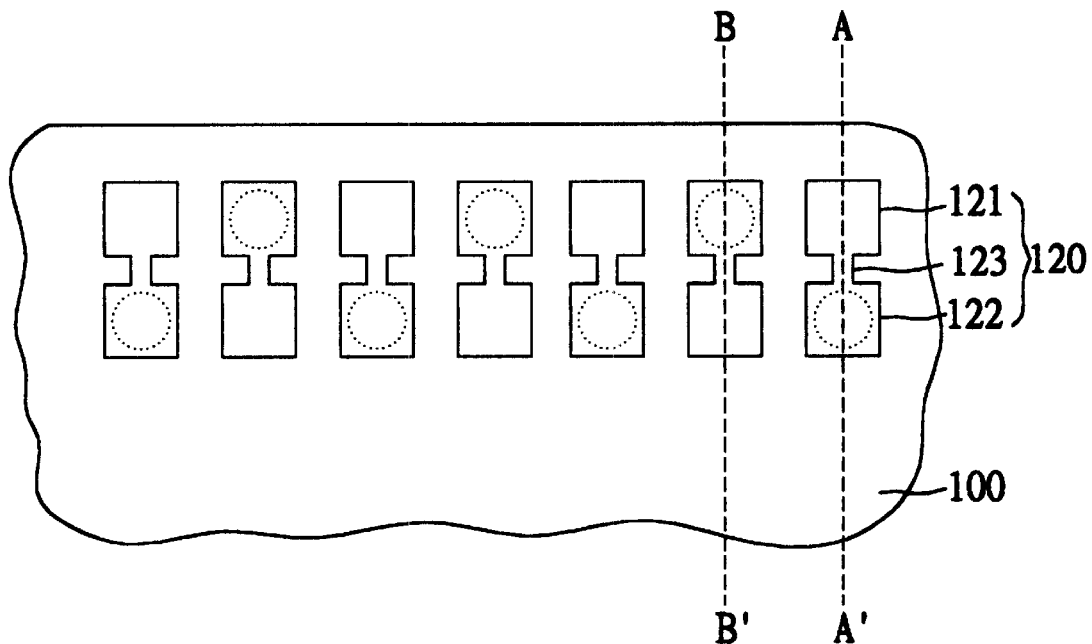
FIG. 3A shows a schematic top view of a semiconductor chip formed with a lined array of dual-pad blocks by the flip-chip bumping technology according to the invention.
Figure 3B:
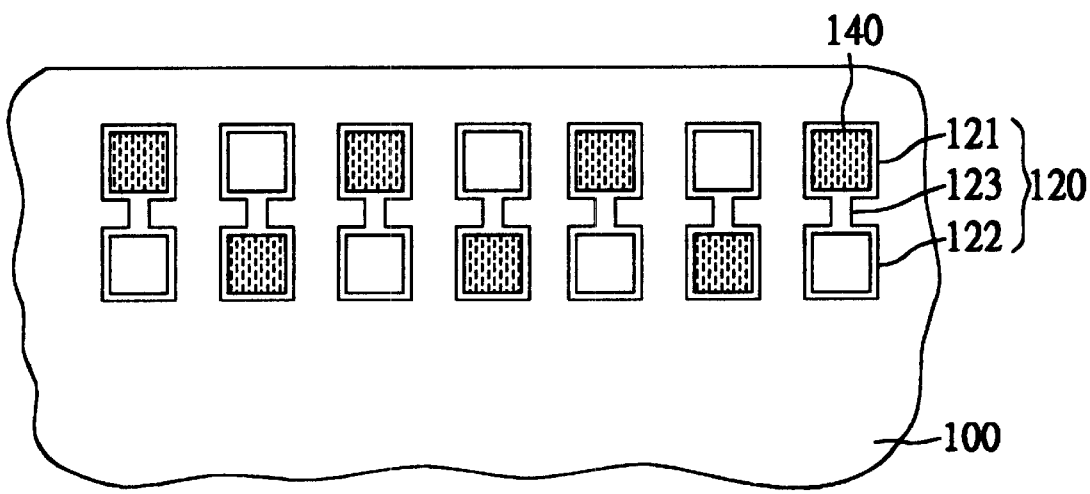
FIG. 3B shows the same of FIG. 3A except when solder bumps are attached.

FIGS. 3A–3B show a schematic top view of a semiconductor chip 100 on which the invention is implemented for flip-chip application; and FIGS. 4A–4D are schematic cross-sectional diagrams used to depict the fabrication of a conventional flip-chip bumping structure over the semiconductor chip 100 (the cross-sectional views of the semiconductor chip 100 are cutting through the line A–A' and B–B' in FIG. 3A).

Figure 4A:
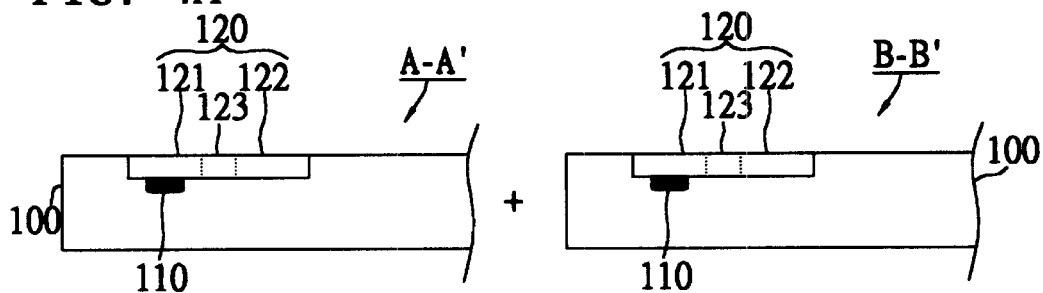
FIGS. 4A–4D are schematic cross-sectional diagrams used to depict the procedural steps for fabricating a flip-chip bumping structure according to the invention.

Referring to FIG. 3A together with FIG. 4A, the semiconductor chip 100 is predefined with a plurality of internal I/O points 110. In accordance with the invention, the semiconductor chip 100 is formed with a lined array of dual-pad blocks 120 respectively over these I/O points 110, each dual-pad block 110 including a first pad 121, a second pad 122 beside the first pad 121, and a bridging strip 123 for electrically interconnecting the first pad 121 and the second pad 122. These dual-pad blocks 120 are fabricated from a suitable electrically-conductive material, such as aluminum (Al) or copper (Cu). In other embodiments, the bridging strip 123 can be as wide as the first pad 121 and the second pad 122, although the required material cost would be higher.

The dual-pad blocks 120 are respectively electrically connected to their corresponding I/O points 110. In this embodiment, the respective first pads 121 of the dual-pad blocks 120 are laid directly over the internal I/O points 110 of the semiconductor chip 100 to establish the required electrical connection, as illustrated in FIGS. 4A–4D. However, it is also permissible to arrange the respective second pads 122 of the dual-pad blocks 120 directly over the internal I/O points 110 of the semiconductor chip 100.

In accordance with the invention, the respective first pads 121 of the dual-pad blocks 120 are alternately designated to serve as bump pads and test pads; while in a reversed order, the respective second pads 122 of the same are alternately designated to serve as test pads and bump pads. In the case of FIG. 3A, for example, those pads that are marked by a dotted circle are designated to serve as test pads, while all the other pads are designated to serve as bump pads.

Figure 4B:
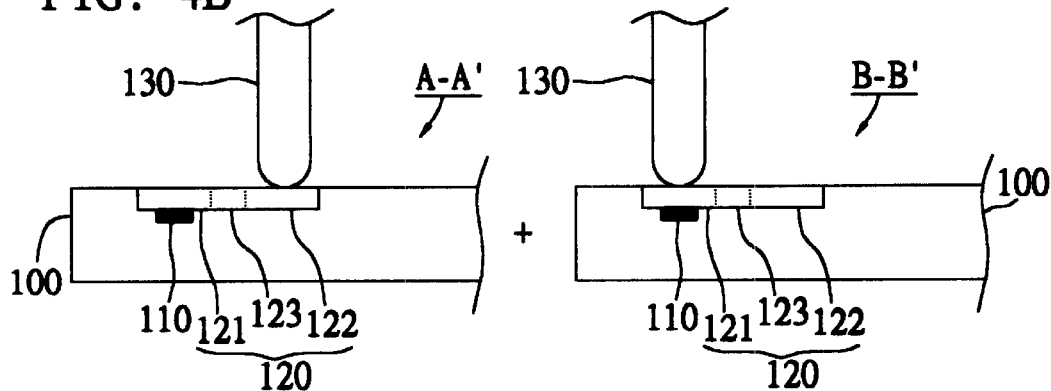

Referring to FIG. 4B together with FIG. 3A, during testing procedure, a test circuit card (not shown) with a set of probing needles 130 (only two probing needles are shown in FIG. 4A) is used to check whether the internal circuitry of the semiconductor chip 100 would function properly. These probing needles 130 are set to come in touch with the respective test-pad portions of the dual-pad blocks 120 (i.e., those pads that are indicated by a dotted circle in FIG. 3A). This allows the test circuit card (not shown) to be electrically coupled to the internal circuitry of the semiconductor chip 100 via the I/O points 110.

Figure 4C:
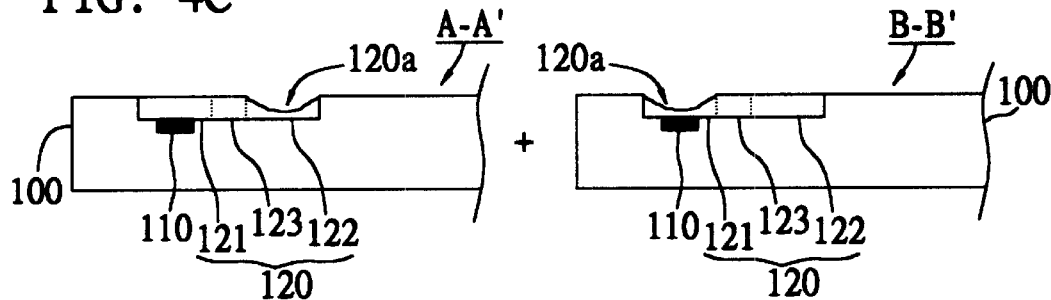

Referring to FIG. 4C together with FIG. 3A, the repeated pressing of the probing needles 130 on the test-pad portions of the dual-pad blocks 120 would leave some scratches 120a over the test-pad portions of the dual-pad blocks 120. However, since the test-pad portions of the dual-pad blocks 120 are only a provisional structure that will become useless after the testing procedure is completed, the existence of the scratches 120a can be disregarded.

Figure 4D:
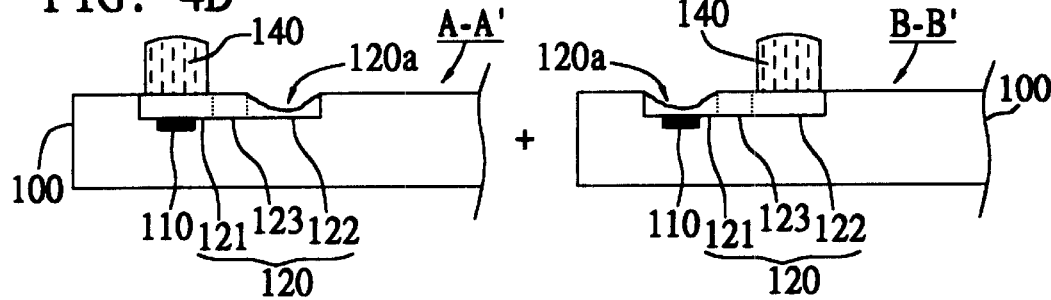

Referring to FIG. 4D together with FIG. 3B, in the next step, a bumping process is performed to form a-plurality of solder bumps 140 respectively over the bump-pad portions of the dual-pad blocks 120. Since the bump-pad portions of the dual-pad blocks 120 can be left unscratched during the earlier testing procedure, it would help assure the quality and reliability of the attachment of the solder bumps 140 to the bump-pad portions of the dual-pad blocks 120.

Subsequent steps to bond the semiconductor chip 100 onto a substrate (not shown) are all conventional techniques which are not within the spirit and scope of the invention, so description thereof will not be given in this specification.

Figure 1:
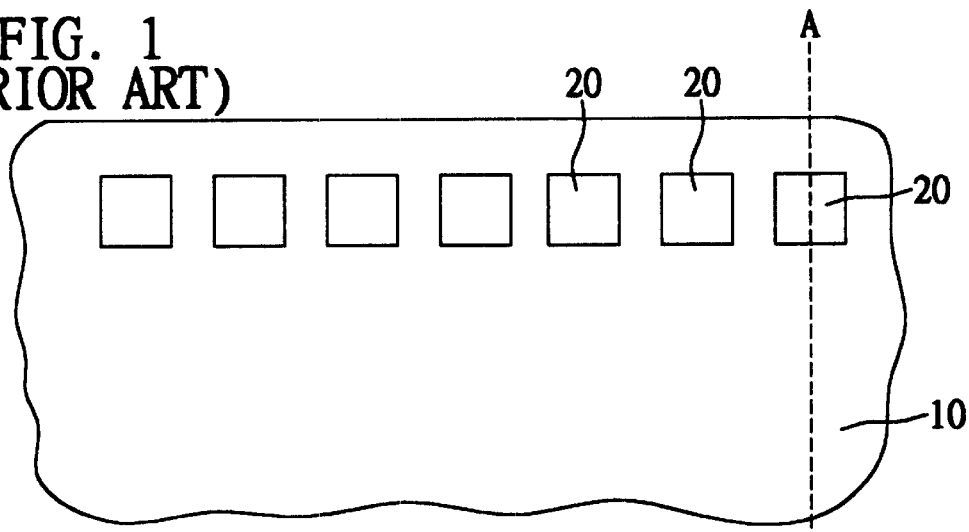
FIG. 1 (PRIOR ART) shows a schematic top view of a conventional semiconductor chip used for flip-chip application.
Figure 2A:
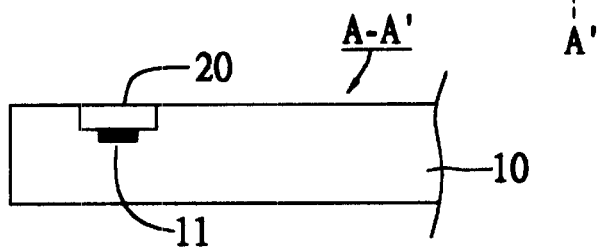
FIGS. 2A–2D (PRIOR ART) are schematic cross-sectional diagrams used to depict the fabrication of a conventional flip-chip bumping structure over the semiconductor chip of FIG. 1.
Figure 2B:
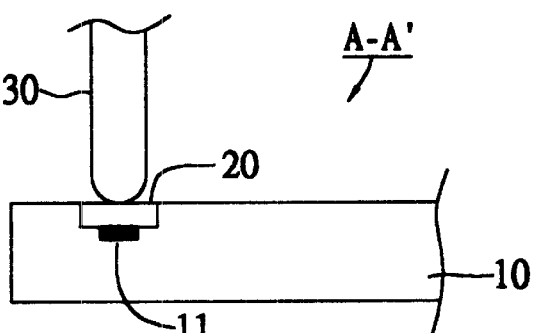
Figure 2C:
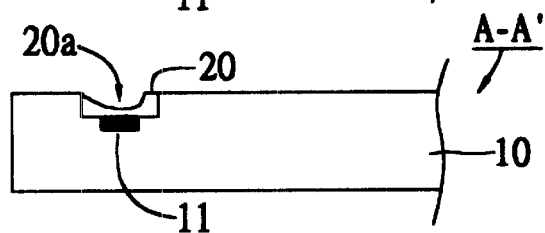
Figure 2D:
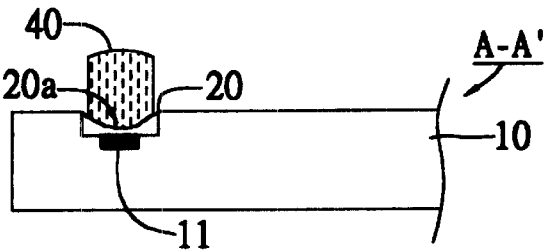

By comparison of FIG. 3A with FIG. 1, it can be seen that, since the test-pad portions of the dual-pad blocks 120 are patterned in a staggered manner, it allows the distance between adjacent test pads to be about 1.4 times greater than the prior art shown in FIG. 1. This feature allows the pitch of the probing needles used to implement the testing procedure to be increased, so that the testing procedure can be implemented in an easier manner.

Moreover, as illustrated in FIG. 3B, since the respective first and second pad portions 121, 122 of the dual-pad blocks 120 are alternately designated to serve as bump pads, it can be seen that the attached solder bumps 140 are also patterned in a staggered formation and thereby are slightly more widely spaced than those in the prior art.

Compared to the prior art of U.S. Pat. No. 5,719,449, since the dual-pad blocks 120 utilized by the invention are laid directly over the I/O points 110 of the semiconductor chip 100 (in other words, both the test pads and bump pads are laid directly over the I/O points 110), the invention can be implemented without having to fabricate additional electrical connecting paths as in the case of the prior art of U.S. Pat. No. 5,719,449. The invention is therefore more simplified in process and thus more cost-effective to implement than this prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a flip-chip bumping structure over a semiconductor chip having a plurality of predefined I/O points, comprising the steps of:
   (1) forming a plurality of electrically-conductive dual-pad blocks respectively over the I/O points of the semiconductor chip, each dual-pad block including:
      (i) a first pad; and
      (ii) a, second pad located beside and electrically connected to the first pad;
   (2) designating the respective first and second pads of the dual-pad blocks alternately as bump pads and test pads; and
   (3) performing a testing procedure to the internal circuitry of the semiconductor chip by probing through the test-pad portions of the dual-pad blocks.

2. The method of claim 1, further comprising the step of:
   (4) forming a plurality of solder bumps respectively over the bump-pad portions of the dual-pad blocks.

3. The method of claim 1, wherein in said step (1), the dual-pad blocks are made of aluminum.

4. The method of claim 1, wherein in said step (1), the dual-pad blocks are made of copper.

5. A method for fabricating a flip-chip bumping structure over a semiconductor chip having a plurality of predefined I/O points, comprising the steps of:
   (1) forming a plurality of electrically-conductive dual-pad blocks respectively over the I/O points of the semiconductor chip, each dual-pad block including:
      (i) a first pad; and
      (ii) a second pad located beside and electrically connected to the first pad;
   (2) designating the respective first and second pads of the dual-pad blocks alternately as bump pads and test pads;
   (3) performing a testing procedure to the internal circuitry of the semiconductor chip by probing through the test-pad portions of the dual-pad blocks; and
   (4) forming a plurality of solder bumps respectively over the bump-pad portions of the dual-pad blocks.

6. The method of claim 5, wherein in said step (1), the dual-pad blocks are made of aluminum.

7. The method of claim 5, wherein in said step (1), the dual-pad blocks are made of copper.

8. A flip-chip bumping structure on a semiconductor chip having a plurality of predefined I/O points, which comprises:
   (a) a lined array of electrically-conductive dual-pad blocks formed over the semiconductor chip and respectively electrically connected to the I/O points of the semiconductor chip, each dual-pad block including:
      (a1) a first pad; and
      (a2) a second pad located beside and electrically connected to the first pad;
   wherein
   the respective first and second pads of the dual-pad blocks are alternately designated as bump pads and test pads; and
   (b) a plurality of solder bumps respectively formed over the bump-pad portions of the dual-pad blocks.

9. The flip-chip bumping structure of claim 8, wherein the dual-pad blocks are made of aluminum.

10. The flip-chip bumping structure of claim 8, wherein the dual-pad blocks are made of copper.

* * * * *